United States Patent [19]

Cosentino

[11] Patent Number: 4,983,531
[45] Date of Patent: Jan. 8, 1991

[54] METHOD OF FABRICATING A SINGLE POLYSILICON BIPOLAR TRANSISTOR WHICH IS COMPATIBLE WITH A METHOD OF FABRICATING CMOS TRANSISTORS

[75] Inventor: Stephen J. Cosentino, Gilbert, Ariz.

[73] Assignee: Motorola, Inc., Schaumburg, Ill.

[21] Appl. No.: 478,390

[22] Filed: Feb. 12, 1990

[51] Int. Cl.[5] .......................................... H01L 21/331
[52] U.S. Cl. ..................................... 437/31; 437/162;
            437/193; 437/984; 437/200; 148/DIG. 19;
            148/DIG. 123; 357/34
[58] Field of Search ................. 437/31, 32, 33, 160,
            437/162, 984, 200, 193, 57, 58, 59, 56, 34;
            148/DIG. 123, DIG. 124, DIG. 19; 357/34, 35,
                                                        59, 43

[56] References Cited

U.S. PATENT DOCUMENTS

| | | | |
|---|---|---|---|
| 4,484,388 | 11/1984 | Iwasaki | 437/59 |
| 4,694,562 | 9/1987 | Iwasaki et al. | 437/57 |
| 4,746,623 | 5/1988 | Lane | 437/33 |
| 4,769,337 | 9/1988 | Maeda | 437/28 |
| 4,778,774 | 10/1988 | Blossfeld | 437/31 |
| 4,818,720 | 4/1989 | Iwasaki | 437/58 |
| 4,829,015 | 5/1989 | Schaber et al. | 437/31 |
| 4,849,364 | 7/1989 | Scovell et al. | 437/31 |
| 4,873,199 | 10/1989 | Hunt | 437/31 |
| 4,874,717 | 10/1989 | Neppl et al. | 437/59 |

FOREIGN PATENT DOCUMENTS

| | | | |
|---|---|---|---|
| 0244171 | 11/1987 | European Pat. Off. | 437/31 |
| 0148863 | 11/1981 | Japan | 437/59 |
| 0123724 | 7/1983 | Japan | 437/31 |

Primary Examiner—Brian E. Hearn
Assistant Examiner—T. N. Quach
Attorney, Agent, or Firm—Joe E. Barbee; Miriam Jackson

[57] ABSTRACT

An improved bipolar transistor of a BiCMOS integrated circuit is fabricated by utilizing a nitride layer over a thin silicon dioxide layer combined with a polysilicon layer. This bipolar structure has a self-aligned, P-type extrinsic base which results in lower base resistance and improved performance.

5 Claims, 3 Drawing Sheets

METHOD OF FABRICATING A SINGLE POLYSILICON BIPOLAR TRANSISTOR WHICH IS COMPATIBLE WITH A METHOD OF FABRICATING CMOS TRANSISTORS

BACKGROUND OF THE INVENTION

This invention relates, in general, to semiconductor devices, and more particularly, to an improved method of fabricating a bipolar transistor which is compatible with a method of fabricating CMOS transistors.

When integrating bipolar transistors with MOS transistors, compromises must be made to either the MOS transistors or the bipolar transistors, or both, in order to integrate the transistors on a single chip. Thus, any improvement which simplifies the BiCMOS fabrication process, or improves the electrical characteristics of the transistors is desirable. Some BiCMOS circuits require the bipolar transistors to have improved performance. In order to fabricate a high performance bipolar transistor, it is essential to minimize base resistance. A lower base resistance will improve the switching speed of the bipolar transistor. A bipolar process which is very compatible with the MOS process is desirable to reduce the number of processing steps and the number of photolithography steps. This will allow for an improvement in yield and a decrease in cycle time.

By now it should be appreciated that it would be advantageous to provide an improved method of fabricating a high performance bipolar transistor that is also compatible with a method of fabricating MOS transistors.

Accordingly, it is an object of the present invention to provide an improved method of fabricating bipolar transistors of a BiCMOS integrated circuit.

Another object of the present invention is to provide an improved method of fabricating a bipolar transistor of a BiCMOS integrated circuit having a reduced base resistance.

A further object of the present invention is to provide a method of fabricating a bipolar transistor having a self-aligned extrinsic base.

SUMMARY OF THE INVENTION

In accordance with the present invention, the above and other objects and advantages are provided by a method of fabricating a bipolar transistor which is highly compatible with a method of fabricating MOS transistors. A single polysilicon bipolar transistor utilizes a self-aligned P+ extrinsic base region to lower base resistance and further improve the transistor performance. The use of a nitride layer over a silicon dioxide layer, combined with a polysilicon layer permits the fabrication of this improved bipolar structure.

DETAILED DESCRIPTION OF THE DRAWINGS

Figure 1:
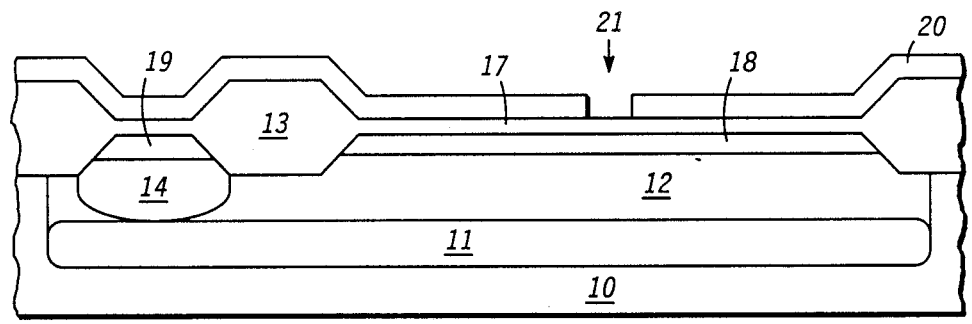
FIGS. 1 through 5 illustrate enlarged, cross-sectional views of a bipolar transistor of the present invention during various stages of fabrication utilizing a first embodiment of the present invention.

FIG. 1 illustrates an enlarged, cross-sectional view of a bipolar transistor in a beginning stage of fabrication. For illustrative convenience, only an NPN bipolar transistor will be fabricated. However, it should be understood that in a BiCMOS circuit, combinations of NPN and PNP transistors are typically formed in combination with PMOS and NMOS transistors. The CMOS portion of the circuit will not be illustrated here. The processing steps used in the present invention are standard processes well known in the art, unless otherwise specified. What is shown is an isolated area of a P-type substrate 10, an N-type buried layer 11, an N-type well 12, upon which field oxide regions 13 are grown. A suitable method of forming field oxide regions 13 is with the use of an oxide, polysilicon, and silicon nitride mask (not shown), however, other processes which are also well known in the art are also suitable. An N-type deep collector 14 is formed between two field oxide regions 13. N-type deep collector 14 reduces the series resistance of the collector contact to the active NPN transistor to be fabricated by lowering the resistance between the surface of the integrated circuit and N-type buried layer 11, which serves as the collector. A thin silicon dioxide layer 17 is then grown on the bare silicon surface. Silicon dioxide layer 17 acts as the gate oxide for the CMOS portion of the circuit, and is thus preferably of a thickness of approximately 100 to 200 angstroms. An $N^-$-type region 19 is then formed in deep collector region 14 to enhance the doping concentration of deep collector 14. $N^-$-type region 19 is the same implant as is used for the $N^-$-type source/drain regions of the CMOS transistors (not shown). At this time the $P^-$-type source/drain regions are formed in the CMOS portion of the circuit. This $P^-$-type implant is not utilized in the bipolar portion of the circuit, and thus is not illustrated here. Subsequently, an active base region 18 is formed in the bipolar section of the circuit. Afterwards, a nitride layer 20 is deposited on the circuit. The thickness of nitride layer 20 is preferably approximately 1,000 to 2,000 angstroms. Nitride layer 20 is then etched to provide an emitter opening 21 in the bipolar section of the circuit, as is shown in FIG. 1. The etching of nitride layer 20 requires an etch that will preferentially etch nitride over silicon dioxide, in order for the etching to stop on silicon dioxide layer 17. A suitable way to do this is by using a dry etch, preferably a Reactive Ion Etch (RIE).

Figure 2:
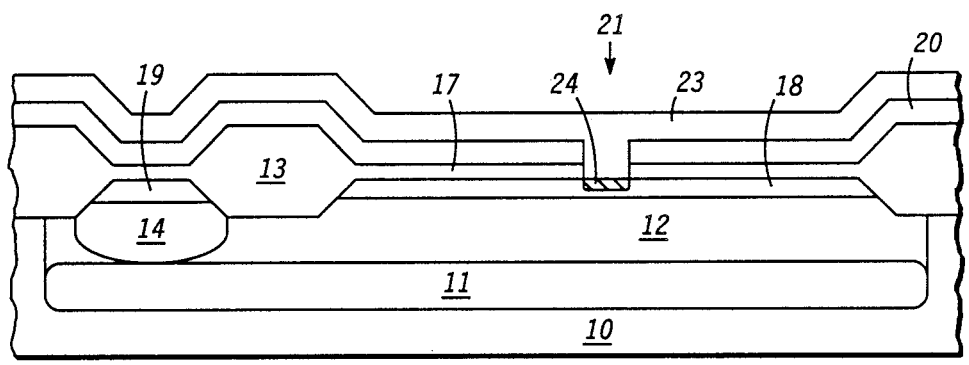

FIG. 2 illustrates the structure of FIG. 1 further along in the fabrication process. Silicon dioxide layer 17 in emitter opening 21 of nitride layer 20 is removed by a wet silicon dioxide etch. By using a wet etch to remove silicon dioxide layer 17, RIE damage to the silicon substrate, where an emitter is to be formed, is prevented. Thereafter, a polysilicon layer 23 is deposited over nitride layer 20 and in emitter opening 21. The thickness of polysilicon layer 23 is preferably approximately 1,500 to 3,000 angstroms. Subsequently, all of polysilicon layer 23 is implanted with an N-type dopant, preferably arsenic of a dose of approximately 5 to $10 \times 10^{15}$ atoms/cm$^3$. However, other suitable dopants and doses may be used. Next, the circuit is subjected to a thermal anneal, preferably a rapid thermal anneal, in order to drive the N-type dopant from polysilicon layer 23 into active base region 18 to form an emitter region 24.

Figure 3:
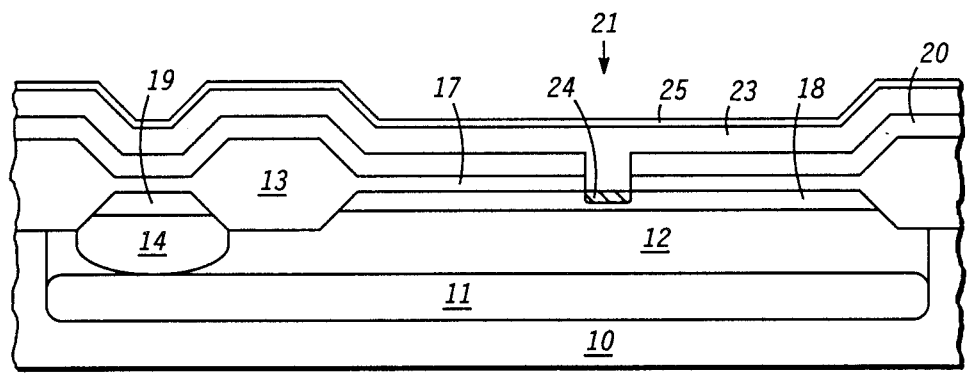

Shown in FIG. 3 is the structure of FIG. 2 further along in the fabrication process. A silicide layer 25 is formed on polysilicon layer 23. Silicide layer 25 is preferably comprised of titanium, tungsten, platinum, cobalt, or the like.

Figure 4:
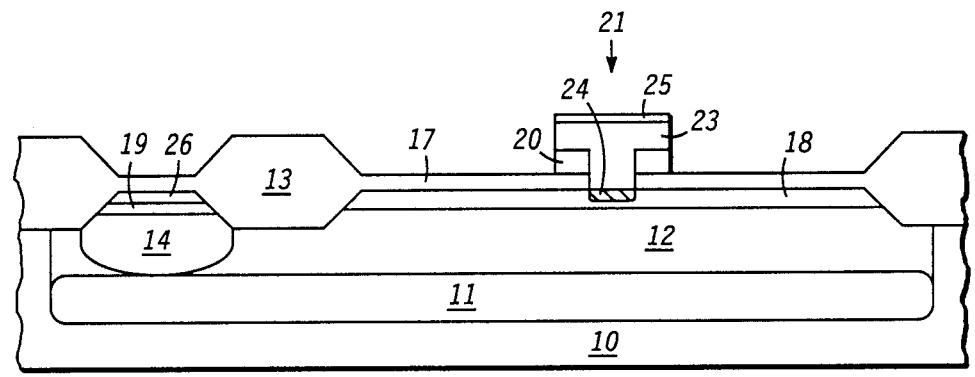

FIG. 4 illustrates the structure of FIG. 3 further along in the fabrication process. A photolithography and etch process is used to etch portions of silicide layer 25, polysilicon layer 23, and nitride layer 20. A portions of silicide layer 25, polysilicon layer 23, and nitride layer 20 is left surrounding emitter opening 21. Polysilicon layer 23 preferably overlaps emitter opening 21 by 0.5 to 1.0 microns in order to provide the spacing between emitter region 24 and an extrinsic base region to be formed. The etching of nitride layer 20 is preferably accomplished by RIE to stop on silicon dioxide layer 17. The use of an oxide etch stop eliminates RIE damage to active base region 18. When nitride layer 20 is etched in the bipolar portion, nitride spacers are formed in the CMOS portion (not illustrated). At this time N+-type source/drain regions are formed in the CMOS portion of the circuit. At the same time, N+-type region 26 is formed in N−-type region 19 to further enhance the doping of deep collector 14.

Figure 5:
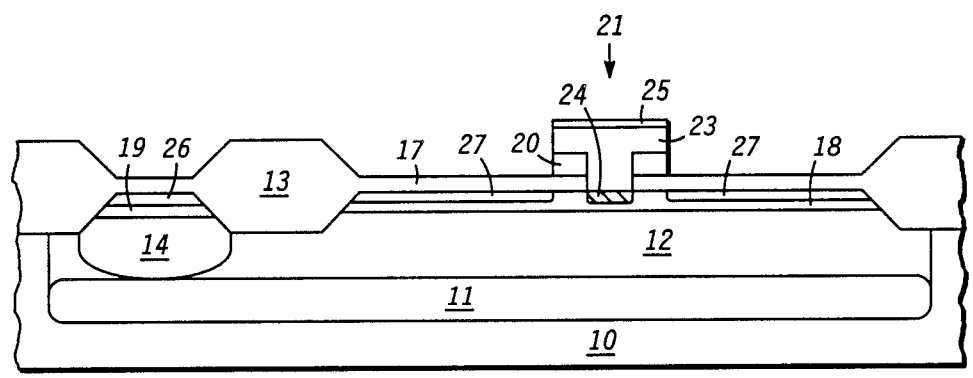

FIG. 5 illustrates the structure of FIG. 4 with a P+-type extrinsic base 27 formed in active base region 18. P+-type extrinsic base 27 is preferably formed by implanting boron of a concentration of approximately $5 \times 10^{14}$ to $5 \times 10^{15}$ atoms/cm$^3$. A photoresist mask (not shown) is used to mask out the implantation of boron into deep collector 14. Note that the P+-type extrinsic base 27 is self-aligned to polysilicon region 23 and thus to emitter region 24. This allows for a reduction in base resistance because the spacing between extrinsic base 27 and emitter region 24 is reduced. A reduction in base resistance provides for a bipolar transistor having faster switching speeds. The dopants used to form P+-type extrinsic base 27 are also used as the P+-type source/drains in the CMOS portion of the circuit.

Figure 6:
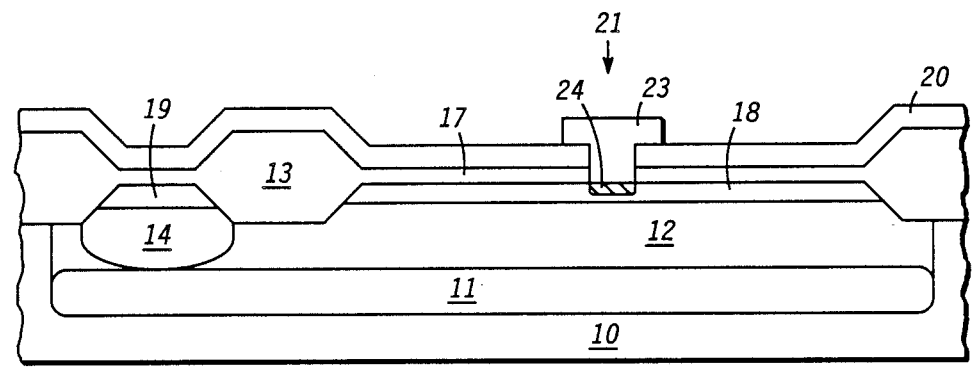
FIGS. 6 through 9 illustrate enlarged, cross-sectional views of a bipolar transistor of the present invention during various stages of fabrication utilizing a second embodiment of the present invention.

FIGS. 6 through 9 illustrate an alternative method of forming substantially the same structure as is shown in FIG. 5. The method illustrated by FIGS. 1 through 5 is, however, the preferable method of carrying out the present invention. FIG. 6 illustrates the structure of FIG. 2 further along in the fabrication process. The same numerals will be used to represent the same layers or regions as shown in FIGS. 1 through 5. Instead of forming silicide layer 25 on all of polysilicon layer 23, polysilicon layer 23 is first partially etched using standard photolithography and etch processes so that a portion of polysilicon layer 23 remains in emitter opening 21 and overlaps nitride layer 20.

Figure 7:
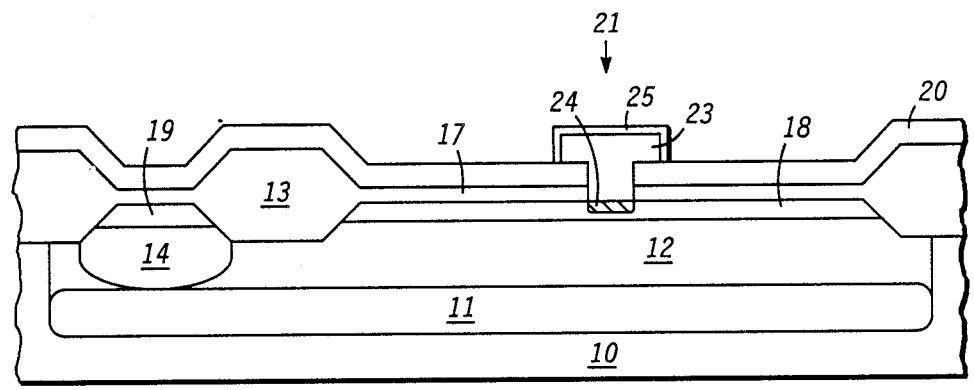

FIG. 7 illustrates the structure of FIG. 6 further along in the fabrication process. Silicide layer 25 is then formed on the surface and sides of polysilicon layer 23.

Figure 8:
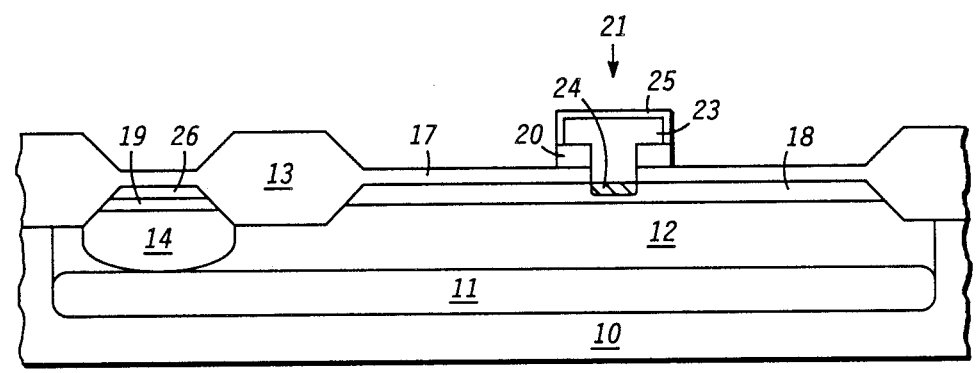

FIG. 8 illustrates the structure of FIG. 7 further along in the fabrication process. Nitride layer 20 is then etched by utilizing silicide layer 25 as a hard mask. The preferable way of etching nitride layer 20 is the same as described with reference to FIG. 4. N+-type region 26 is formed in the same manner as described with reference to FIG. 4 as well.

Figure 9:
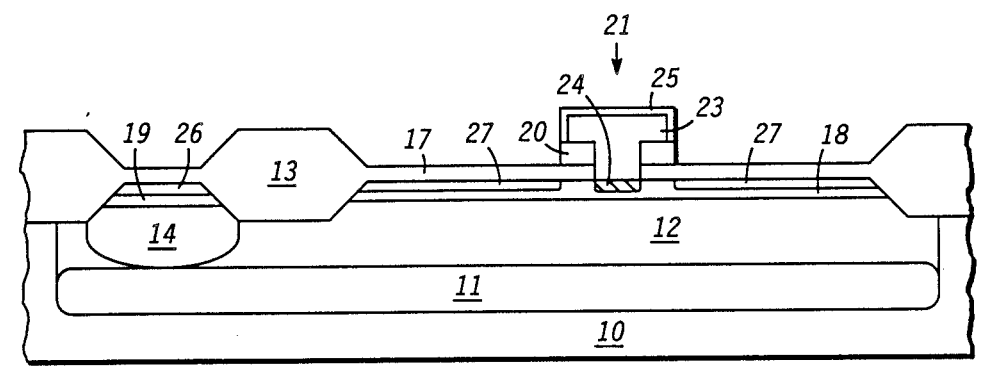

FIG. 9 illustrates the structure of FIG. 8 with a P+-type extrinsic base 27 formed in active base region 18. This part of the process is the same as is described with reference to FIG. 5. As one can see, the structure of FIG. 9 is substantially similar to the structure of FIG. 5. The difference is that silicide layer 25 is formed on the sides of polysilicon layer 23 when using the alternative process as shown in FIGS. 6 through 9. Those skilled in the art will be able to recognize that other variations may be made in processing which are not illustrated here that would essentially result in the same structure as shown in FIGS. 5 and 9.

The processing steps used to complete the fabrication of the structure shown in FIG. 5 or 9 is standard and well known in the art, and thus are not illustrated here.

By now it should be appreciated that there has been provided a new and improved method of fabricating a high performance bipolar transistor that is compatible with a method of fabricating CMOS transistors.

I claim:

1. A method of fabricating a bipolar transistor that is compatible with a BiCMOS process, comprising the steps of:
   providing a semiconductor substrate having a buried layer which serves as a collector;
   forming a silicon dioxide layer on the substrate;
   forming a nitride layer on the silicon dioxide layer;
   forming an active base region in the substrate;
   etching an emitter opening in the nitride layer;
   etching the silicon dioxide layer exposed by the emitter opening;
   forming a polysilicon layer on the nitride layer and in the emitter opening;
   doping the polysilicon layer;
   annealing the substrate to form an emitter region in the active base region below the portion of the polysilicon layer which is in the emitter opening;
   forming a silicide layer on the polysilicon layer;
   etching the silicide layer, the polysilicon layer, and the nitride layer to leave a portion of the silicide layer, the polysilicon layer, and the nitride layer surrounding the emitter opening; and
   forming an extrinsic base region in the active base region, wherein the extrinsic base region is defined by the polysilicon layer and the nitride layer.

2. The method of claim 1 wherein the nitride layer is etched by using a reactive ion etch which does not etch the silicon dioxide.

3. The method of claim 1 further comprising the step of forming a deep collector region in the substrate before forming the active base region.

4. A method of fabricating a bipolar transistor that is compatible with a BiCMOS process, comprising the steps of:
   providing a semiconductor substrate having a buried layer which serves as a collector;
   forming a silicon dioxide layer on the substrate;
   forming a nitride layer on the silicon dioxide layer;
   forming an active base region in the substrate;
   etching an emitter opening in the nitride layer;
   etching the silicon dioxide layer exposed by the emitter opening;
   forming a polysilicon layer on the nitride layer and in the emitter opening;
   doping the polysilicon layer;
   etching the polysilicon layer to leave a portion in the emitter opening and partially overlapping the nitride layer;
   annealing the substrate to form an emitter region in the active base region below the portion of the polysilicon layer which is in the emitter opening;
   forming a silicide layer on the polysilicon layer;
   etching the nitride layer not covered by the polysilicon layer; and forming an extrinsic base region in the active base region, wherein the extrinsic base region is defined by the polysilicon layer and the nitride layer.

5. A method of fabricating a bipolar transistor that is compatible with a BiCMOS process, comprising the steps of:
   providing a semiconductor substrate having a buried layer which serves as a collector;
   forming a thin silicon dioxide layer on the substrate;
   forming a nitride layer on the silicon dioxide layer;
   forming an active base region in the substrate;
   dry etching an emitter opening in the nitride layer;
   wet etching the silicon dioxide layer exposed by the emitter opening;
   forming a polysilicon layer on the nitride layer and in the emitter opening;
   doping the polysilicon layer;
   annealing the substrate to form an emitter region in the active base region below the portion of the polysilicon layer which is in the emitter opening;
   forming a silicide layer on the polysilicon layer;
   etching the silicide layer, the polysilicon layer, and the nitride layer to leave a portion of the silicide layer, the polysilicon layer, and the nitride layer surrounding the emitter opening; and
   forming an extrinsic base region in the active base region, wherein the extrinsic base region is defined by the polysilicon layer and the nitride layer.

* * * * *